(12) United States Patent  
Rosen et al.

(10) Patent No.: US 7,558,541 B2  
(45) Date of Patent: Jul. 7, 2009

(54) AMPLIFIER GAIN AND PHASE STABILIZER

(75) Inventors: Harold A. Rosen, Santa Monica, CA (US); James D. Thompson, Manhattan Beach, CA (US)

(73) Assignee: The Boeing Company, Chicago, IL (US)

( * ) Notice: Subject to any disclaimer, the term of this patent is extended or adjusted under 35 U.S.C. 154(b) by 519 days.

(21) Appl. No.: 11/001,978

(22) Filed: Dec. 1, 2004

(65) Prior Publication Data

US 2006/0116090 A1   Jun. 1, 2006

(51) Int. Cl.  
*H01Q 11/12* (2006.01)

(52) U.S. Cl. ............... 455/127.2; 455/126; 455/127.3; 455/127.4; 330/149; 330/136

(58) Field of Classification Search ............... 455/127.2  
See application file for complete search history.

(56) References Cited

U.S. PATENT DOCUMENTS

| | | | |
|---|---|---|---|
| 4,618,831 A | | 10/1986 | Egami et al. |
| 5,121,077 A | * | 6/1992 | McGann ............... 330/149 |
| 5,329,244 A | * | 7/1994 | Fujita et al. ............ 330/149 |
| 5,528,196 A | | 6/1996 | Baskin et al. |
| 6,421,528 B1 | | 7/2002 | Rosen et al. |

FOREIGN PATENT DOCUMENTS

WO   WO 00/02324 A   1/2000

OTHER PUBLICATIONS

PCT Written Opinion PCT/US2005/040055, Mar. 8, 2006, The Boeing Co.  
PCT Int'l Search Report PCT/US2005/040055, Mar. 8, 2006, The Boeing Co.

* cited by examiner

*Primary Examiner*—Yuwen Pan  
*Assistant Examiner*—Ajibola Akinyemi  
(74) *Attorney, Agent, or Firm*—Tung & Associates

(57) ABSTRACT

Methods and apparatus are provided for stabilizing the phase and gain of an amplifier in a power pooling arrangement. A pilot signal combining a reference carrier frequency with a reference sideband frequency is passed through the amplifier via an adjustable phase shifter and an adjustable attenuator in the amplifier input line. A portion of the amplified pilot signal is coupled from the output of the amplifier and mixed with the reference frequency. The remaining audio frequency signal is compared to a reference (input) audio signal to determine phase and gain changes during amplification in the amplifier. Phase and gain control signals are developed from this comparison, and are fed back to the adjustable phase shifter and adjustable attenuator, respectively, in order to compensate an incoming signal for phase and gain variations in the amplifier.

19 Claims, 4 Drawing Sheets

AMPLIFIER GAIN AND PHASE STABILIZER

TECHNICAL FIELD

The present invention generally relates to satellite-based communications systems, and more particularly relates to the stabilization of the gain and phase characteristics of amplifiers used for satellite transmissions.

BACKGROUND

Satellite-based communication systems are typically used to provide TV broadcast transmissions as well as other types of communication signals over a large geographical area, such as the contiguous 48 states of the U.S. In a typical satellite-based communication system, the satellite receives signals from a feeder Earth station and then re-transmits the signals to end user stations throughout a target area. Ideally, the satellite transmissions are intended to deliver an equitable level of signal power, known as the effective isotropic radiated power (EIRP), to every end user station within the satellite coverage area. One obstacle in achieving ideal EIRP coverage, however, is the adverse effect of localized signal path losses that are typically caused by weather-related conditions such as rain. That is, rain can attenuate transmitted signal strength to a degree that may result in poor quality reception or even a total loss of signal to an end user.

To overcome this problem, some satellite transmission systems have been equipped with power-distribution techniques that can enable the individual adjustment of power to the satellite output feed horns in order to boost the amount of power being transmitted to rain-affected areas. One power-distribution technique utilizes signal amplifiers connected to hybrid matrices in order to share amplifier resources for a number of feed horns. In this type of power pooling arrangement, the amplifiers are generally configured to have identical gain and phase parameters in order to achieve optimal performance of the system. However, if these gain and phase parameters are not held constant, cross talk can occur between the output ports, and a loss of output power may result.

The stability of the amplifier gain and phase parameters can be adversely affected by influences such as changes in temperature, aging of associated internal and external components, power supply voltage drift, and so forth. In addition, the phase and gain parameters of the line lengths between the amplifiers and the hybrid matrices can also affect the performance of the power pooling arrangement.

Accordingly, it is desirable to provide a phase and gain stabilization system that maintains constant phase and gain parameters for amplifiers in a power pooling arrangement over the frequency band of interest. In addition, it is desirable to provide an adjustment capability to compensate for phase and gain differences that may be caused by unequal line lengths between the amplifiers and their associated components. Furthermore, other desirable features and characteristics of the present invention will become apparent from the subsequent detailed description and the appended claims, taken in conjunction with the accompanying drawings and the foregoing technical field and background.

BRIEF SUMMARY

According to various exemplary embodiments, devices and methods are provided for stabilizing the phase and gain parameters of an amplifier, such as the type for use in a satellite transmitter power pooling arrangement. One method utilizes a pilot signal comprising a reference carrier signal and a reference sideband signal within the operating bandwidth of the amplifier. The pilot signal is introduced into the amplifier and a sample of the amplified pilot signal at the amplifier output is mixed with a reference carrier to extract the sideband signal. The sideband signal is divided into two signals, which are converted into a phase control signal and a gain control signal. The phase control signal and the gain control signal are fed back to the amplifier input circuit to modify the phase and amplitude, respectively, of an input signal to the amplifier, in order to compensate for phase and gain parameter changes within the amplifier.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention pertain to the area of satellite communications where a satellite transmitter sub-system utilizes a multi-amplifier power pooling arrangement for individual power adjustment to the respective feed horns. Unless all the amplifiers in such an arrangement have essentially identical phase and gain characteristics, cross talk and power losses can occur at the output ports, thus reducing the efficiency of the transmitter sub-system. To overcome this problem, a phase and gain stabilization network is disclosed herein that operates to maintain essentially constant and identical phase and gain characteristics for each amplifier in a resource-sharing configuration.

Figure 1:
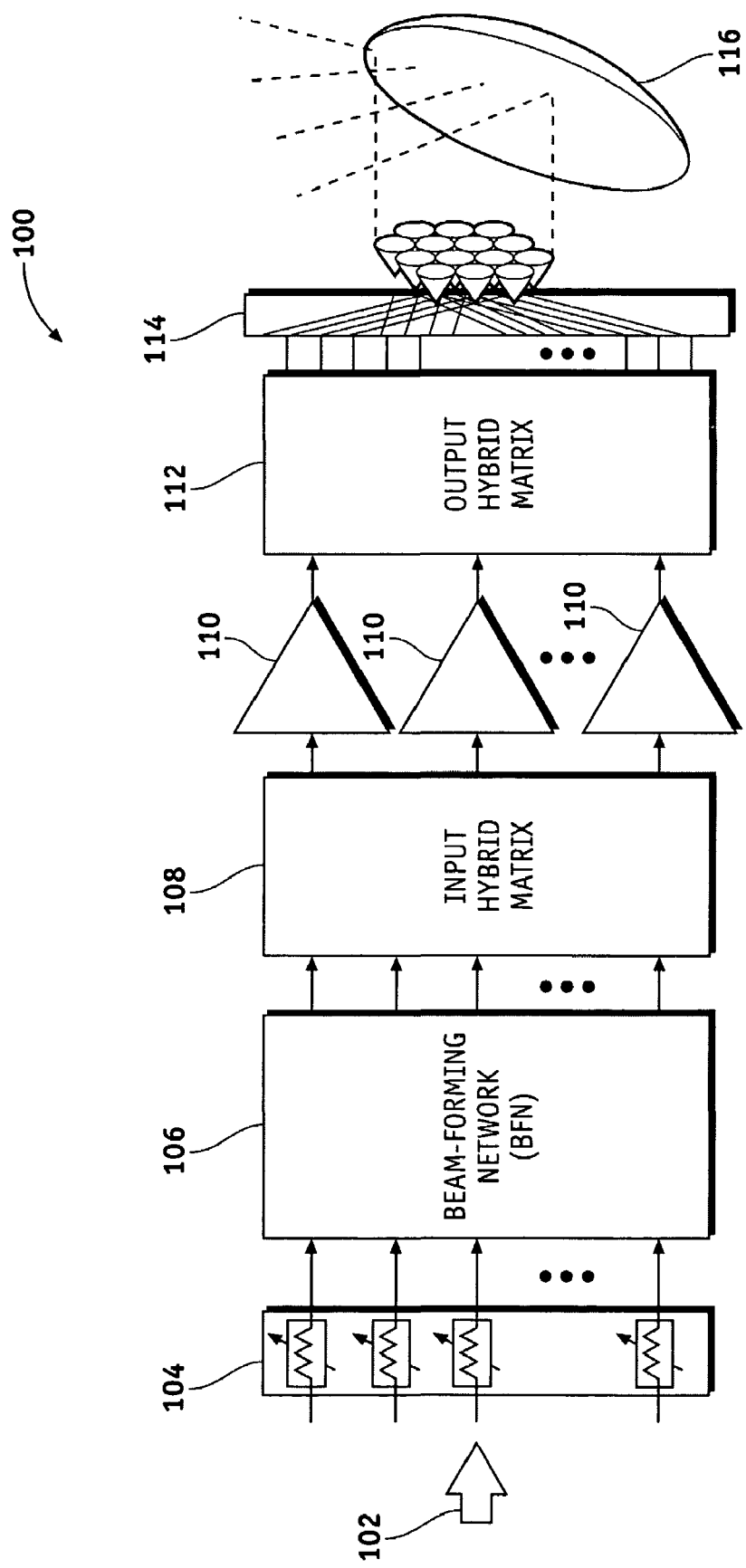
FIG. 1 is an exemplary block diagram of a satellite transmitter subsystem.

A typical power pooling transmitter sub-system 100 for a communication satellite (not shown) is illustrated in simplified block diagram form in FIG. 1. An input communication signal 102 is typically distributed through a bank of commandable attenuators 104 to a beam-forming network 106. In general, beam-forming network 106 is made up of power dividers and phase shifters that divide the communication signal into a desired number of inputs for an input hybrid matrix 108. The corresponding outputs of hybrid matrix 108 are connected to the input ports of a group of amplifiers 110, which are shown in a power pooling configuration. As previously noted in the Background, power pooling arrangements can be used to enable individual feed horn power control to compensate for particular weather-related signal path attenuations, as described in U.S. Pat. No. 6,421,528. The amplified signal outputs of amplifiers 110 are typically connected to an output hybrid matrix 112 that distributes the communication signal components to a feed horn assembly 114. A description of this type of hybrid matrix-to-amplifier-to-hybrid matrix arrangement can be found in U.S. Pat. No. 4,618,831. The outputs of feed horn assembly 114 are typically directed to an antenna 116 for broadcast to target areas within the satellite coverage area.

In general, the type of amplifiers appropriate for use in satellite transmitter sub-systems are characterized by high gain and wide bandwidth capabilities. One type of amplifier possessing these characteristics is the traveling wave tube, or TWT. The TWT has long been used in many types of RF and microwave applications, such as radar and telecommunications, and is currently used as a signal amplifier in satellite communication applications. Basically, the TWT achieves amplification of an RF or microwave signal through the interaction of a cathode-generated electron beam and a slow wave structure (e.g., a helix) within the TWT. For example, an input RF signal such as a TV broadcast signal that is applied to a TWT helix will typically interact with the energy of the cathode-generated electron beam in a manner that results in amplification of the RF signal at the TWT output.

As previously noted, the TWT is typically characterized as a high gain, wide bandwidth device, which is generally advantageous for communications applications. However, the phase shift in a TWT is typically sensitive to changes in the cathode-to-helix voltage, which determines the electron beam velocity. For example, a fractional phase change is typically equal to the negative one-half of a fractional change in the beam voltage. In the case of a TWT having a nominal 4,800 degrees of phase shift, a one-quarter of one per cent change in beam voltage would typically result in six (6) degrees of phase change. In a satellite transmitter sub-system application, six (6) degrees of phase change can be considered a reasonable upper limit in regard to cross talk. However, a typical TWT power pooling configuration may include individual power supplies for each TWT, and the relative voltage drift between the various power supplies may lead to an excessive amount of phase variation.

In addition to the previously described effect of beam voltage on phase shift changes, there is also an effect on the gain characteristic of a TWT due to aging of the cathode. As a cathode ages, the electron beam current typically varies, affecting the gain of the TWT. For example, a gain change of one tenth of a neper, or approximately 0.9 db, would have a similar effect on cross talk as would six (6) degrees of phase change. When phase or gain changes (errors) occur in a TWT power pooling arrangement, the amplified output signals may couple to unintended output ports, thereby leading to cross talk and output power losses.

Figure 2:
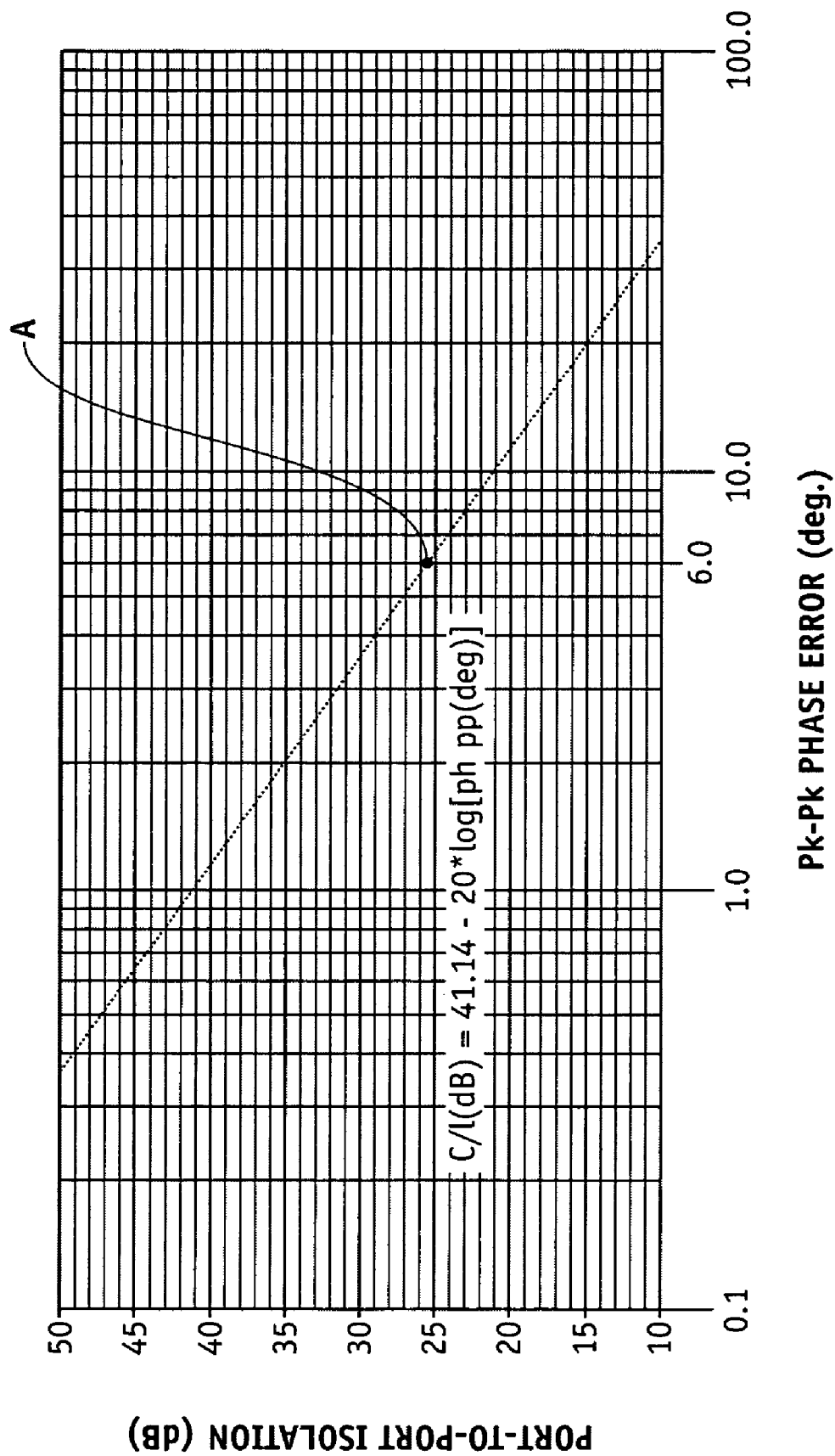
FIG. 2 is an exemplary graph of port-to-port isolation values versus phase error magnitude.
Figure 3:
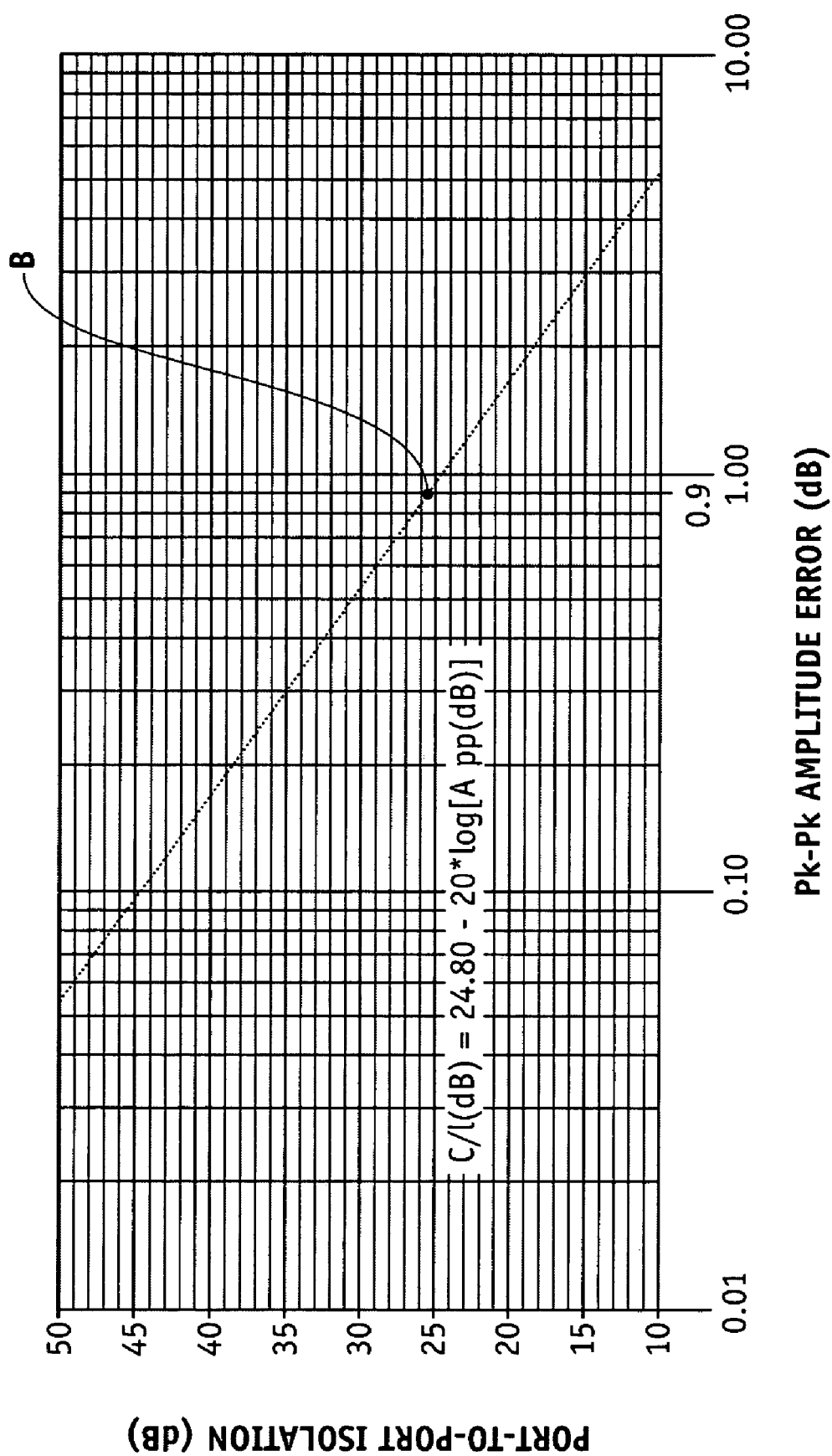
FIG. 3 is an exemplary graph of port-to-port isolation values versus amplitude error magnitude.

Typical examples of port-to-port isolation values versus phase and gain error magnitude are shown graphically in FIGS. 2 and 3, respectively. In FIG. 2, port-to-port isolation in db is plotted on the vertical axis, and peak-to-peak phase error in degrees is plotted on the horizontal axis. The relationship between port isolation and phase error can be determined by the expression:

$$C/I(db) = 41.14 - 20 * \log[ph\ pp\ (deg)]$$

Where C/I is the ratio of carrier signal to interference signal, as represented by port-to-port isolation.

Similarly, FIG. 2 depicts port-to-port isolation plotted against peak-to-peak amplitude error in accordance with the expression:

$$C/I(db) = 24.80 - 20 * \log[amp\ pp\ (db)]$$

As noted above, the effect on port-to-port isolation of a gain error of 0.9 db would approximately equal the effect of a phase error of six (6) degrees. This relationship can be seen on the plots of FIGS. 2 and 3, where point A in FIG. 2 (6 degrees) and point B in FIG. 3 (0.9 db) each correspond to a port-to-port isolation value of approximately 26 db.

In order to control this type of phase and gain error from exceeding levels that would degrade the operational efficiency of a power pooling system, an active phase and gain stabilization network can be configured for each of the amplifiers in the power pooling system. One such stabilization network uses a low power pilot signal (i.e., relative to the power level of the main communication signal, herein designated as "broadband") at the approximate center frequency of the operating band of the amplifier. In the exemplary embodiment described below in conjunction with FIG. 4, an audio signal (e.g., 1 KHz) is used as the sideband on a relatively high frequency carrier. With this approach, the amplitude and phase comparison with a reference audio signal can be done in a narrow bandwidth after demodulation. The use of a narrow bandwidth minimizes the impact of noise in determining the necessary amplitude and phase corrections. The pilot signal is typically introduced into the amplifier in conjunction with the broadband signal, and the phase and gain of the amplified pilot signal output are detected and converted into phase and gain control signals, respectively. These phase and gain control signals can then be used as compensating feedback signals in order to stabilize the phase and gain characteristics of the amplifier. By setting the pilot signal to the approximate center of the operating frequency band, the errors that are typically associated with variations in gain slope and phase slope between the various amplifiers in a power pooling arrangement tend to be minimized.

Figure 4:
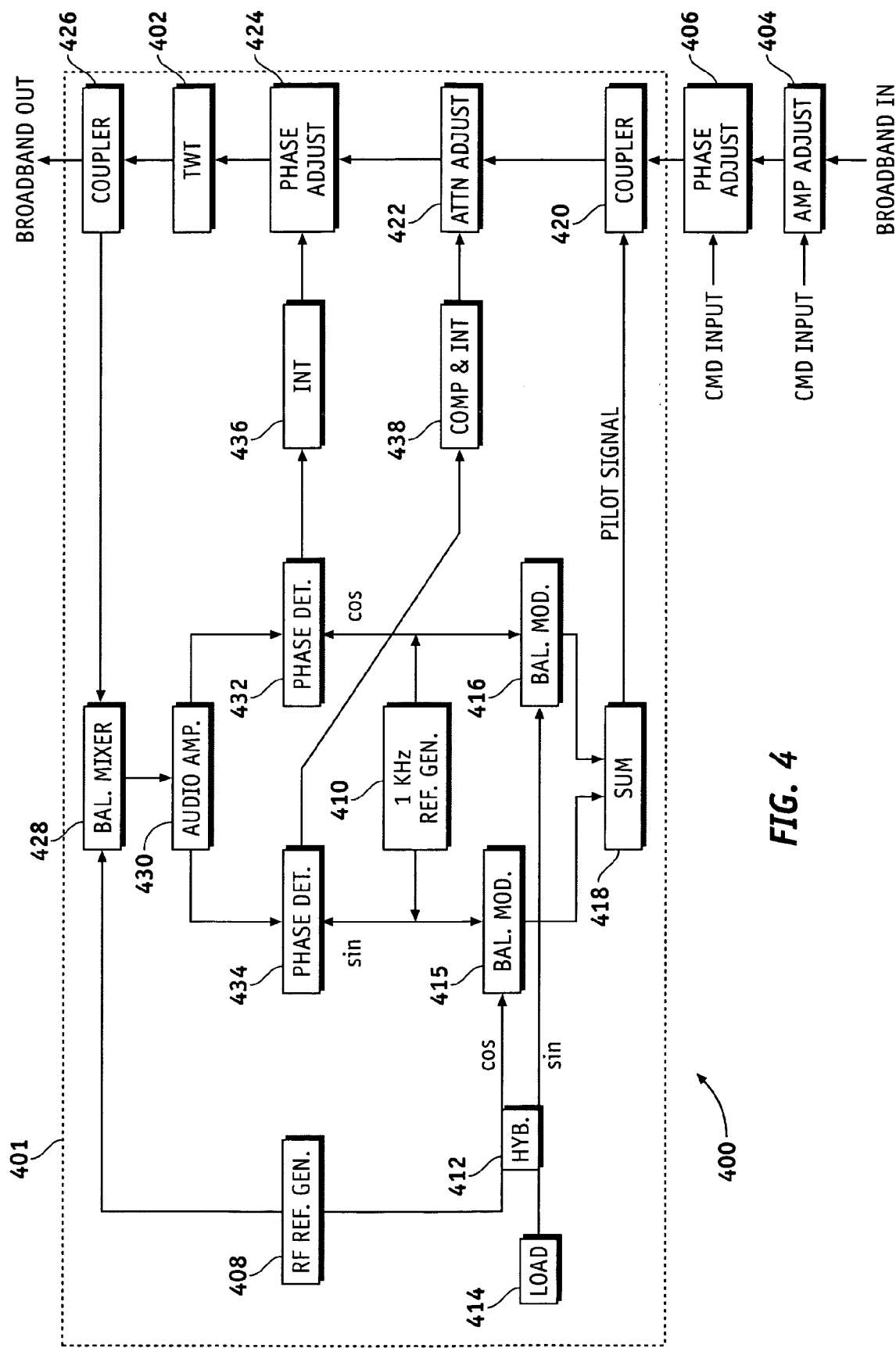
FIG. 4 is an exemplary embodiment of a phase and gain stabilization network for a TWT amplifier.

According to an exemplary embodiment of a phase and gain stabilization network 400, as shown in block diagram form in FIG. 4, a TWT amplifier 402 is incorporated within an active stabilization loop 401. In addition, an amplitude adjust device 404 (typically a commandable attenuator) and a phase adjust device 406 (typically a commandable phase shifter) are inserted in series with the broadband signal input line to active stabilization loop 401. As such, amplitude adjust device 404 and phase adjust device 406 are generally configured to receive command inputs that enable separate gain and phase adjustments, respectively, to compensate for unequal line lengths in the connections between TWT 402 and the hybrid matrices (not shown) in a typical power pooling arrangement. Amplitude adjust device 404 will generally have an attenuation range of approximately 0 to 4 db, while phase adjust device 406 will typically have a phase shift range of approximately plus or minus 180 degrees. Amplitude adjust device 404 and phase adjust device 406 may be of analog or digital design. If they are configured as digital devices, the least significant bit for amplitude adjust device 404 will generally be 0.25 db, and for phase adjust device 406, the least significant bit will generally be 3 degrees.

In the exemplary embodiment shown in FIG. 4, an RF reference generator 408 outputs carrier frequency signals at approximately 19.95 GHz that are centered within the operating frequency band (19.7 to 20.2 GHz) of TWT 402. In addition, an audio reference generator 410 outputs quadrature (cosine and sine) audio frequency signals at approximately 1 KHz. In this embodiment, a single sideband modulator configuration, as described below, derives a pilot signal from a combination of the carrier frequency signal and the audio frequency signal, and this pilot signal is used for detecting phase and gain variations in TWT 402. That is, a 19.95 GHz output signal from reference generator 408 is passed through a 90-degree hybrid 412, which has a load 414 on one port. Hybrid 412 outputs quadrature (cosine and sine) 19.95 GHz reference signals to balanced modulator 415 and balanced modulator 416, respectively. Concurrently, audio reference generator 410 outputs 1 KHz quadrature (cosine and sine) signals to balanced modulator 416 and balanced modulators 414, respectively. The signal outputs of balanced modulators 415 and 416 are combined in a sum device 418 to provide a single sideband suppressed carrier signal at 19,950.001 MHz, herein designated as a pilot signal.

The exemplary pilot signal described above, typically set at a power level of approximately one milliwatt, is coupled into the broadband input line of TWT 402 via a directional coupler 420. A typical coupling factor for directional coupler 420 is −30 db, thereby resulting in a one-microwatt power level pilot signal at the output of directional coupler 420. The one-microwatt pilot signal is then directed through a voltage controlled attenuator 422 and a voltage controlled phase shifter 424 prior to reaching the input of TWT 402. As will be described below, voltage controlled attenuator 422 and voltage controlled phase shifter 424 are typically used to apply compensating gain and phase adjustments to the broadband signal in the input line to TWT 402.

The exemplary pilot signal is amplified by TWT 402 and passed through a directional coupler 426. Assuming a nominal amplification of 55 db for TWT 402 and a nominal coupling factor of −55 db for directional coupler 426, the pilot signal level at the output of directional coupler 426 is approximately one microwatt, which is about 20 db below the level of the coupled broadband signal. The coupled output from directional coupler 426 is fed to a balanced mixer 428, where it is mixed with a local oscillator signal (19.95 GHz) from RF reference generator 408 at an approximate power level of 3 milliwatts. The output signal from balanced mixer 428 typically contains a 1 KHz signal at a power level of approximately one-quarter microwatt, and also approximately 25 microwatts of the broadband signal. For a balanced mixer 428 nominal output impedance of 50 ohms, the 1 KHz output signal will typically be at a voltage level of approximately 3.5 millivolts. The output signal from balanced mixer 428 is fed to a stabilized audio amplifier 430, which typically has a gain of 50 db and a bandwidth of 1 KHz, with a center frequency of approximately 1 KHz. The resulting output from audio amplifier 430 typically contains a 1 KHz signal at a voltage level of approximately one volt, plus incidental noise associated with the broadband signal of only about 10 millivolts in the narrow 1 KHz band.

The 1 KHz signal out of stabilized audio amplifier 430 is fed into a pair of phase detectors, 432 and 434. Concurrently, phase detectors 432, 434 receive quadrature reference signals at 1 KHz from stabilized audio reference generator 410. In the exemplary embodiment of FIG. 4, phase detector 432 receives a cosine (90 degrees) output from audio reference generator 410, and phase detector 434 receives a sine (0 degrees) output from audio reference generator 410. The signal output of phase detector 432 is typically a DC voltage that is proportional to the phase difference between the 1 KHz signal input from stabilized audio amplifier 430 (representing the output pilot signal) and the 1 KHz reference signal from audio reference generator 410 (representing the input pilot signal). This DC voltage typically represents a change (error) in the phase parameter of TWT 402, and can therefore be used in a feedback loop to correct for phase changes in TWT 402. The DC voltage out of phase detector 432 is typically fed through an integrator 436 prior to being applied to voltage controlled phase shifter 424. As such, the signal output of integrator 436 represents a relatively high gain feedback signal for correcting phase changes in TWT 402. The feedback signal out of integrator 436 is typically applied to voltage controlled phase shifter 424 in a manner that adjusts the phase of the broadband signal passing through voltage controlled phase shifter 424 to compensate for the phase shift error detected in TWT 402. The parameters of this phase control feedback loop are typically designed to drive the output of phase detector 432 to zero, so that phase changes in TWT 402 are canceled by opposite phase changes in voltage controlled phase shifter 424.

The function of phase detector 434 is similar to that of phase detector 432, except that the output signal from phase detector 434 is typically proportional to the gain of TWT 402, and can be used as a gain control feedback signal. In this embodiment, the output signal from phase detector 434 is compared to a predetermined reference voltage in the comparator section of a comparator and integrator 438, where the predetermined reference voltage represents a desired gain for TWT 402. The difference voltage between the phase detector 434 output voltage and the predetermined reference voltage is typically integrated by the integrator section of comparator and integrator 438, and applied as a gain control signal to voltage controlled attenuator 422. This gain control signal is typically applied to voltage controlled attenuator 422 in a manner that adjusts the amplitude of the broadband signal passing through voltage controlled attenuator 422 to compensate for the gain error in TWT 402. As such, this gain control feedback loop is typically designed to stabilize the net gain of the TWT 402 circuit to a desired level.

Accordingly, the shortcomings of the prior art have been overcome by providing an improved phase and gain stabilization network for an amplifier, such as the type of amplifier that is generally used in a satellite transmitter power pooling arrangement. The exemplary embodiment of a phase and gain stabilization network described herein can maintain essentially constant phase and gain parameters for the signal amplifier circuits in power pooling arrangements, such as those that may be used in satellite applications. It will be appreciated that other embodiments of the phase and gain stabilization network described herein may be used for other types of parallel amplifier summing applications (e.g., terrestrial applications), and may be used for other frequency bands as well. Moreover, the exemplary embodiment also provides commandable adjustment capabilities to compensate for phase and gain differences caused by unequal line lengths between the amplifiers and their associated components.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of stabilizing the phase and gain parameters within the operating bandwidth of an amplifier in a power pooling arrangement, comprising the steps of:

generating a pilot signal comprising a suppressed carrier signal with a single audio sideband, the pilot signal set to the approximate center of the operating bandwidth of the amplifier;

applying the pilot signal to a signal input of the amplifier;

coupling off a portion of the amplified pilot signal at a signal output of the amplifier;

extracting the amplified audio signal from the coupled off portion of the amplified pilot signal;

using a first phase detector to receive a first phase-related signal;

receiving a phase-related signal from the first phase detector;

using an adjustable phase shifter configured to receive and control a phase control signal from an integrator;

configuring a second phase detector to receive a second output signal, and to output a gain-related signal;

configuring an adjustable attenuator to receive the gain related signal from a comparator/integrator to generate an integrated gain control signal and to influence the gain of the gain of an input communication signal in accordance with the gain control signal;

feeding back the phase control signal and the gain control signal to the adjustable phase shifter and the adjustable attenuator, respectively, in order to actively modify the phase and amplitude, respectively, of an input signal to the amplifier, to compensate for phase and gain parameter changes within the amplifier.

2. The method of claim 1 wherein the generating step comprises combining a reference carrier signal with a reference sideband signal.

3. The method of claim 1 wherein the extracting step comprises mixing the coupled off portion of the amplified pilot signal with a reference carrier signal input to extract the amplified audio signal.

4. The method of claim 1 wherein the converting step comprises phase detecting and integrating the first signal to generate the phase control signal.

5. The method of claim 1 wherein the converting step further comprises comparing the second signal to a predetermined reference signal to obtain a difference signal, and integrating the difference signal to generate the gain control signal.

6. The method of claim 1 wherein the feeding back step comprises applying the phase control signal to an adjustable phase shifter at the signal input to the amplifier.

7. The method of claim 1 wherein the feeding back step further comprises applying the gain control signal to an adjustable attenuator at the signal input to the amplifier.

8. A phase and gain stabilization network for a communication system amplifier in a power pooling arrangement, the amplifier configured to receive a communication signal at an input and to generate an amplified communication signal at an output, comprising:

a line length phase compensation device configured to adjust the phase of the input communication signal;

a line length gain compensation device connected in series with the line length phase compensation device, the line length gain compensation device configured to adjust the amplitude of the input communication signal;

a carrier frequency reference source configured to generate a carrier frequency output within the operating bandwidth of the amplifier;

a sideband frequency reference source configured to generate a sideband frequency output within the operating bandwidth of the amplifier;

a single sideband modulator configured to receive input signals from the carrier frequency reference source and from the sideband frequency reference source, the single sideband modulator further configured to generate an output pilot signal comprising the carrier frequency and the sideband frequency;

a first directional coupler configured to receive the pilot signal output from the single sideband modulator and to output a portion of the received pilot signal to the signal input of the amplifier, the first directional coupler further configured to receive the phase and gain line length-compensated communication signal from the series combination of the line length phase compensation device and the line length gain compensation device, and to output the phase and gain line length compensated communication signal to the signal input of the amplifier;

a feedback control circuit configured with a second directional coupler at the signal output of the amplifier to couple off a portion of the amplified pilot signal, the feedback control circuit further configured with a balanced mixer configured to receive a carrier frequency reference input from the carrier frequency reference source and to receive the coupled off portion of the amplified pilot signal from the second directional coupler, and to generate an output signal at the sideband frequency;

an amplifier/divider configured to receive the output signal at the sideband frequency from the output of the balanced mixer, the amplifier/divider further configured to amplify and divide the received output signal at the sideband frequency into a first output signal and a second output signal;

a first phase detector configured to receive the first output signal from the amplifier/divider and to output a phase-related signal;

an integrator configured to receive the phase-related signal from the first phase detector and to generate an integrated phase control signal;

an adjustable phase shifter configured to receive the phase control signal from the integrator and to adjust the phase of the input communication signal in accordance with the phase control signal;

a second phase detector configured to receive the second output signal from the amplifier/divider and to output a gain-related signal;

a comparator/integrator configured to receive the gain-related signal from the second phase detector and to generate an integrated gain control signal based on the difference between the gain-related signal and a predetermined gain reference signal;

an adjustable attenuator configured to receive the gain control signal from the comparator/integrator and to influence the gain of the input communication signal in accordance with the gain control signal;

wherein the adjustable phase shifter and the adjustable attenuator are connected in series between the output of the first coupler and the signal input to the amplifier, and wherein the adjustable phase shifter and the adjustable attenuator adjust the phase and amplitude, respectively, of the input communication signal to compensate for changes in the phase and gain parameters of the amplifier.

9. The phase and gain stabilization network of claim 8 wherein the amplifier is a traveling wave type of tube.

10. The phase and gain stabilization network of claim 8 wherein the single sideband modulator comprises two balanced modulators each configured to receive quadrature signals from the carrier frequency reference and the sideband frequency reference, and wherein the outputs of the two balanced modulators are summed to form the pilot signal.

11. The phase and gain stabilization network of claim 8 wherein the coupling factor of the first directional coupler is approximately −30 db.

12. The phase and gain stabilization network of claim 8 wherein the coupling factor of the second directional coupler is approximately −55 db.

13. The phase and gain stabilization network of claim 8 wherein the amplifier/divider comprises a stabilized audio amplifier.

14. The phase and gain stabilization network of claim 8 wherein the adjustable phase shifter is voltage-controlled.

15. The phase and gain stabilization network of claim 8 wherein the adjustable attenuator is voltage-controlled.

16. The phase and gain stabilization network of claim 8 wherein the adjustable phase shifter has an approximate range of plus or minus 180 degrees.

17. The phase and gain stabilization network of claim 8 wherein the adjustable attenuator has an approximate range of 0 to 4 db.

18. The phase and gain stabilization network of claim 8 wherein the line length phase compensation device is controllable by remote commands.

19. The phase and gain stabilization network of claim 8 wherein the line length gain compensation device is controllable by remote commands.

\* \* \* \* \*